US009846246B2

(12) United States Patent
Jadrich et al.

(10) Patent No.: US 9,846,246 B2
(45) Date of Patent: *Dec. 19, 2017

(54) METHOD AND APPARATUS WITH TILED IMAGE SENSORS

(71) Applicant: Carestream Health, Inc., Rochester, NY (US)

(72) Inventors: Bradley S. Jadrich, North Port, FL (US); Mark E. Shafer, Fairport, NY (US); Edward A. Tickner, Pittsford, NY (US); Steven F. Entz, Holley, NY (US); Timothy J. Wojcik, Rochester, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/423,645

(22) Filed: Feb. 3, 2017

(65) Prior Publication Data

US 2017/0153334 A1 Jun. 1, 2017

Related U.S. Application Data

(63) Continuation of application No. 14/828,772, filed on Aug. 18, 2015, now Pat. No. 9,599,723.

(51) Int. Cl.
  *G01T 1/20* (2006.01)
  *H01L 31/18* (2006.01)
  *H01L 27/146* (2006.01)

(52) U.S. Cl.
  CPC ........ *G01T 1/2018* (2013.01); *H01L 27/1469* (2013.01); *H01L 27/14663* (2013.01)

(58) Field of Classification Search
  CPC ....... G01T 1/2018; G01T 1/208; H01L 22/12; H01L 31/18
  See application file for complete search history.

(56) References Cited

U.S. PATENT DOCUMENTS

| 3,707,760 | A | 1/1973 | Citrin |
| 4,617,420 | A | 10/1986 | Dilts et al. |
| 4,942,405 | A | 7/1990 | Dody et al. |
| 5,072,074 | A | 12/1991 | DeMaso et al. |
| 5,391,881 | A | 2/1995 | Jeuch et al. |
| 5,453,145 | A | 9/1995 | Beaman et al. |
| 5,670,009 | A | 9/1997 | Tarn et al. |
| 5,834,782 | A | 11/1998 | Schick et al. |
| 5,856,699 | A | 1/1999 | Hayashi et al. |
| 6,262,421 | B1 | 7/2001 | Tran |
| 6,352,875 | B1 | 3/2002 | Hayashi et al. |
| 6,408,110 | B2 | 6/2002 | Schulman |
| 6,426,991 | B1 | 7/2002 | Mattson et al. |
| 6,455,348 | B1 | 9/2002 | Yamaguchi |
| 6,455,899 | B2 | 9/2002 | Kumagai et al. |
| 6,510,195 | B1 | 1/2003 | Chappo et al. |

(Continued)

FOREIGN PATENT DOCUMENTS

| EP | 2 735 888 | 5/2014 |
| WO | 94/25878 A1 | 11/1994 |

(Continued)

*Primary Examiner* — Mark R Gaworecki
(74) *Attorney, Agent, or Firm* — Thompson Hine LLP

(57) ABSTRACT

An M×N array of sensor tiles are attached to a substrate using a compliant layer that includes an adhesive. A thickness of the compliant layer varies depending on a thickness of the sensor tiles so that outward facing sides of the sensor tiles are substantially aligned.

20 Claims, 16 Drawing Sheets

(56) References Cited

U.S. PATENT DOCUMENTS

| | | |
|---|---|---|
| 6,782,076 B2 | 8/2004 | Bowen et al. |
| 6,946,661 B2 | 9/2005 | Vafi et al. |
| 7,067,817 B2 | 6/2006 | Suganuma et al. |
| 7,379,528 B2 | 5/2008 | Mattson et al. |
| 7,450,683 B2 | 11/2008 | Tkaczyk et al. |
| 8,718,226 B2 | 5/2014 | Jorritsma et al. |
| 9,599,723 B2 * | 3/2017 | Jadrich .................. G01T 1/208 |
| 2004/0017224 A1 | 1/2004 | Tumer et al. |
| 2005/0098732 A1 | 5/2005 | Liu et al. |
| 2006/0192087 A1 | 8/2006 | Kuszpet et al. |
| 2007/0158574 A1 | 7/2007 | Petrillo et al. |
| 2007/0268375 A1 | 11/2007 | Robinson et al. |
| 2008/0118023 A1 | 5/2008 | Besson |
| 2008/0253507 A1 | 10/2008 | Levene et al. |
| 2010/0065724 A1 | 3/2010 | Hughes et al. |
| 2013/0306875 A1 | 11/2013 | Wei |
| 2014/0035084 A1 | 2/2014 | George et al. |

FOREIGN PATENT DOCUMENTS

| | | |
|---|---|---|
| WO | 97/39575 A2 | 10/1997 |
| WO | 98/02922 | 1/1998 |
| WO | 01/48831 A1 | 7/2001 |
| WO | 2005/047859 | 5/2005 |
| WO | 2007/117799 A3 | 10/2007 |
| WO | 2008/003351 A1 | 1/2008 |
| WO | 2008/052965 | 5/2008 |

* cited by examiner

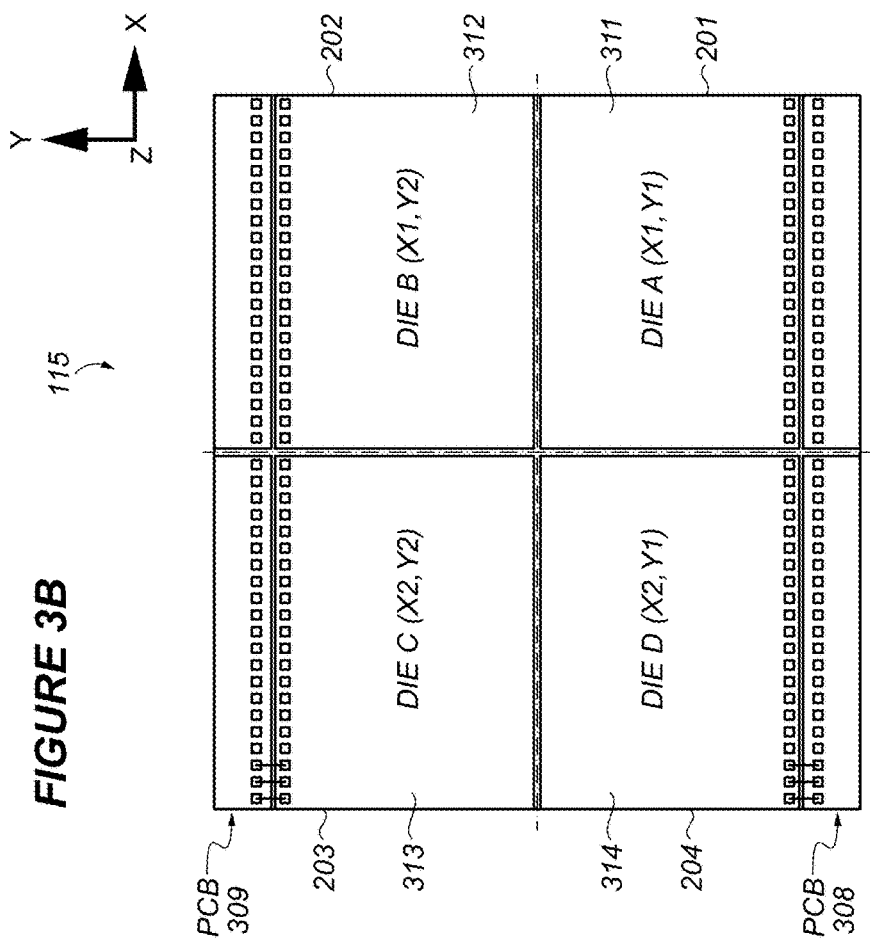
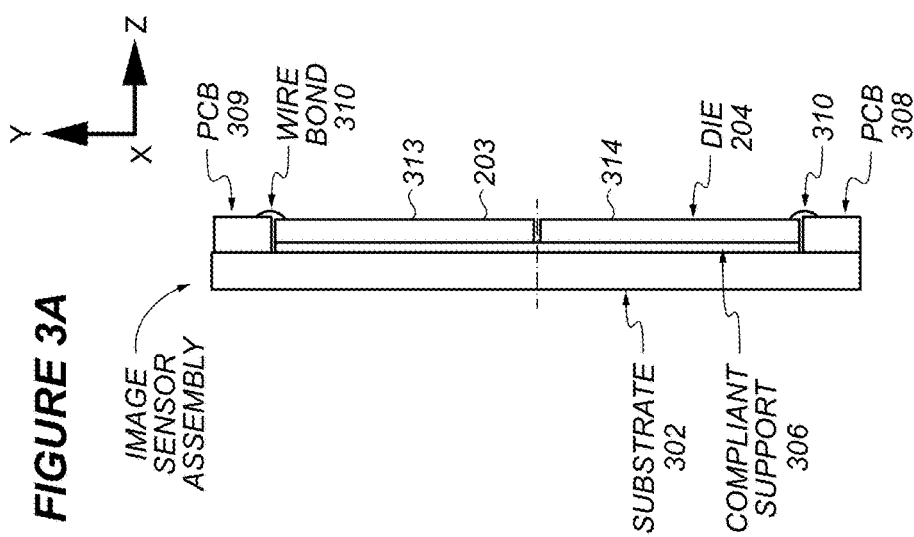

METHOD AND APPARATUS WITH TILED IMAGE SENSORS

CROSS REFERENCE TO RELATED APPLICATIONS

This application is a Continuation of U.S. Ser. No. 14/828,772, filed on Aug. 18, 2015, entitled "METHOD AND APPARATUS WITH TILED IMAGE SENSORS", in the names of Bradley S. Jadrich et al., which is incorporated herein in its entirety.

BACKGROUND OF THE INVENTION

The present invention generally relates to the field of medical radiographic imaging systems and, in particular, to digital radiography (DR) X-ray detectors sometimes referred to as flat panel detectors (FPD), and methods of making flat panel detectors.

Solid-state, ionizing radiation based detectors used in projection radiography typically require direct or indirect conversion image sensors. Direct conversion image sensors, such as made using selenium, directly capture X-rays in a photo-conductive material to produce electrical signals in an array of pixels. Indirect sensors such as made using amorphous silicon (a-Si), and complementary metal oxide semiconductor (CMOS), use a scintillating material to convert X-rays to visible light in the pixel array. To fabricate large area flat panel detectors, smaller planar, rectangular sensor arrays may be tiled together in an M×N two dimensional arrangement to form larger panels. Thus, accurate alignment and assembly of such smaller image sensor tiles may be desired for particular imaging applications. Embodiments of the presently disclosed invention are intended to provide simple and superior methods to advantageously assemble a plurality of image sensor tiles.

The discussion above is merely provided for general background information and is not intended to be used as an aid in determining the scope of the claimed subject matter.

BRIEF DESCRIPTION OF THE INVENTION

An array of sensor tiles may be attached to a substrate using a compliant film that includes an adhesive. A thickness of the compliant film varies depending on a thickness of the sensor tiles so that outward facing sides of the sensor tiles are coplanar.

In one embodiment, an imaging device may have an array of sensor tiles attached to a substrate on a bottom side of the sensor tiles. A sheet is disposed between the array of sensor tiles and the substrate, the sheet being made from a compressible, compliant material. An adhesive is also disposed between the array of sensor tiles and the substrate on both sides of the sheet.

In another embodiment, a method of fabricating a tiled sensor array includes providing a substantially flat surface, aligning a plurality of sensor tiles using the flat surface, placing a compliant film on a substrate using an adhesive therebetween, pressing the compliant film against the back sides of the plurality of sensor tiles including an adhesive therebetween, and removing the flat surface to release the tiled sensor array and substrate having the compliant film adhered therebetween.

In another embodiment, an apparatus includes an array of photosensitive tiles and a substrate facing a bottom side of the tiles. A compliant film is placed between the array and the substrate, wherein the film includes adhesive. A thickness of the compliant film is different between the substrate and a first one of the tiles as compared to the film between the substrate and a second one of the tiles. The top sides of the sensor tiles are coplanar.

The summary descriptions above are not meant to describe individual separate embodiments whose elements are not interchangeable. In fact, many of the elements described as related to a particular embodiment can be used together with, and possibly interchanged with, elements of other described embodiments. Many changes and modifications may be made within the scope of the present invention without departing from the spirit thereof, and the invention includes all such modifications. The drawings below are intended to be drawn neither to any precise scale with respect to relative size, angular relationship, relative position, or timing relationship, nor to any combinational relationship with respect to interchangeability, substitution, or representation of a required implementation.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 3A is a side view showing a plurality of die in an exemplary tiled image sensor assembly;

FIG. 3B is a top view showing the plurality of die in the exemplary tiled image sensor assembly of FIG. 3A;

DETAILED DESCRIPTION OF THE INVENTION

Figure 1:
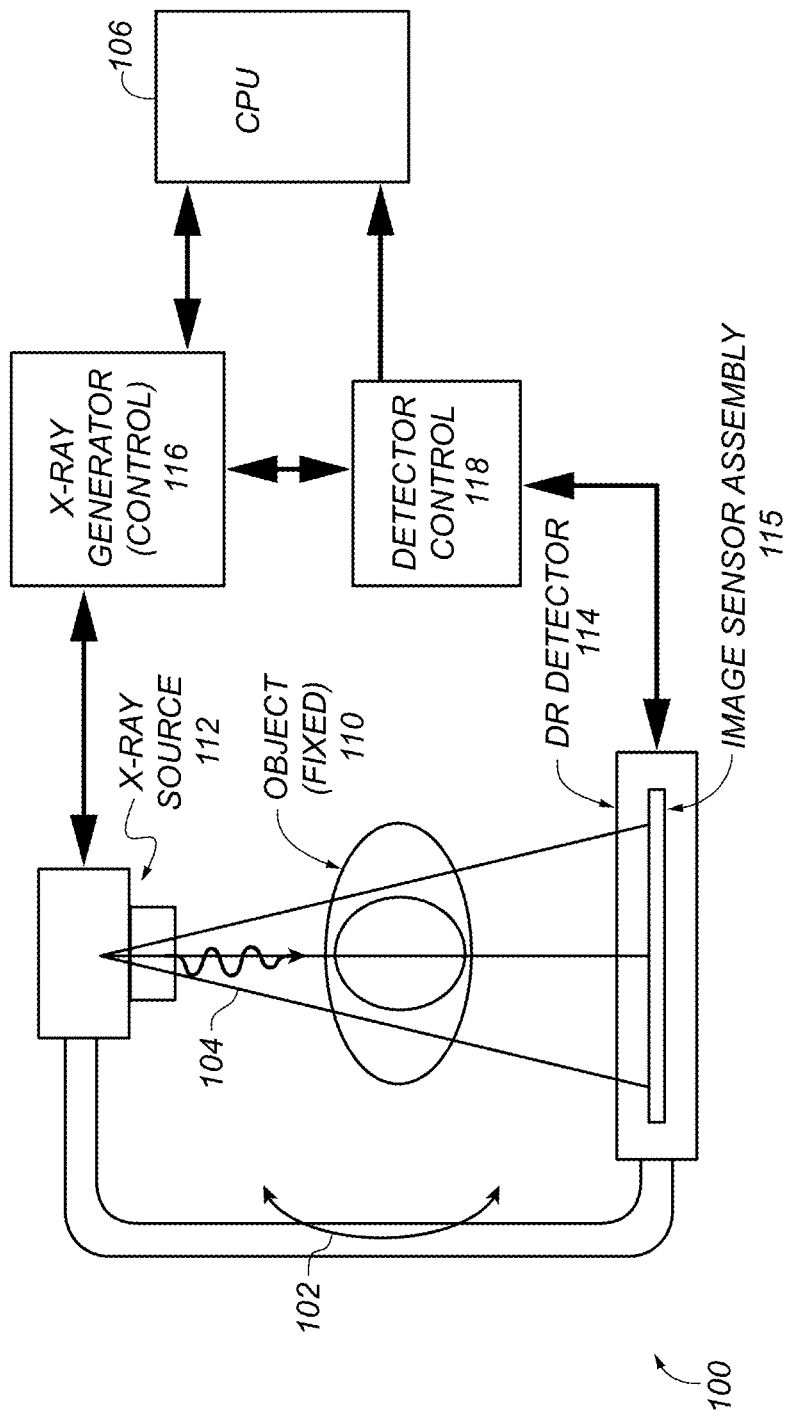
FIG. 1 is a schematic diagram showing an exemplary radiographic imaging system using a DR detector.

A schematic diagram of one exemplary projection X-ray system 100 is shown in FIG. 1. The system 100 may be a stationary fixed exam room system or a mobile X-ray imaging system. The X-ray source 112 and the DR detector 114 may be part of a rotatable system such as a gantry driven system, a C-arm, or table system, for example. The detector 114 is positioned diametrically opposite the x-ray source 112 and an object 110 under examination is positioned therebetween, whereby x-rays 104 pass through the object 110 and are detected by a two-dimensional array of imaging elements, or pixels, in the detector 114. Rotation of the source 112 and detector 114 components in either direction indicated by arrow 102, while maintaining the object 110 at a rotational axis of the source 112 and detector 114, may be used to enable cone beam computed tomography (CBCT) and 3-D image reconstruction applications, such as in medical and dental applications, in the x-ray imaging system 100. The x-ray generator 116 causes the x-ray source 112 to fire one or a sequence of pulses of x-ray radiation 104, which firing may be controlled and synchronized with activation of the detector 114 using detector control circuits 118. Operation and control of the x-ray system 100 components just described may be centralized in a computer system 106. The exemplary DR detector 114 and the image sensor assembly 115 therein, as shown in FIG. 1, will be described in more detail herein. The orientation of x-ray system 100 components as illustrate in FIG. 1 may be varied. The object 110 under examination may be a human or animal patient, or another object, and may be lying on an examination table, standing, sitting upright, or positioned with respect to the source 112 and detector 114 in some other suitable orientation.

Figure 2:
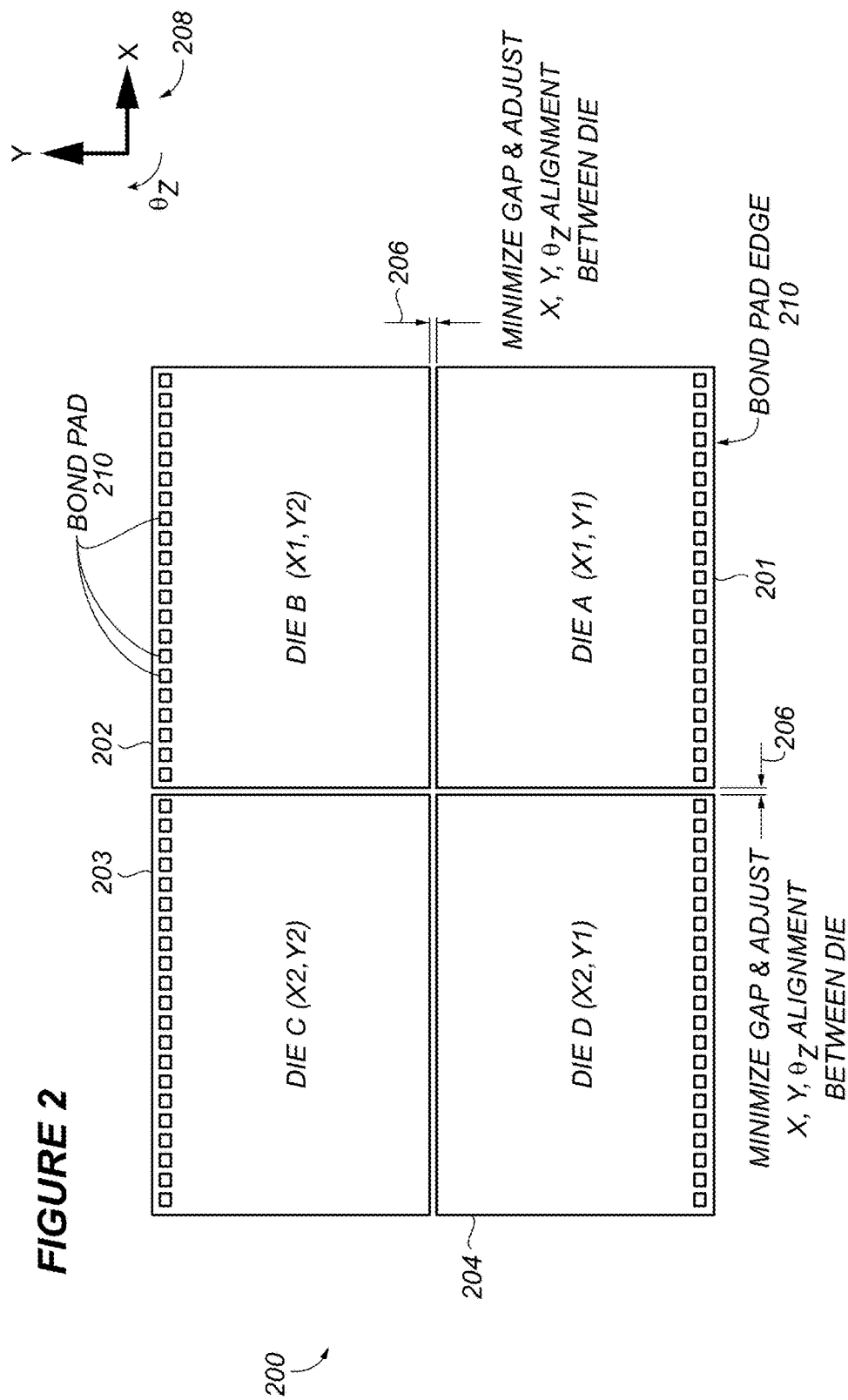
FIG. 2 is a diagram of an exemplary M×N two dimensional arrangement of a plurality of die with alignment orientation.

FIG. 2 is a diagram of an M×N array 200 of image sensor tiles 201-204, as used in one or more disclosed embodiments of the image sensor assembly 115 (FIG. 1) of the present invention. Each of the sensor tiles 201-204 is substantially planar and generally rectangular in shape as illustrated herein. Each of the sensor tiles 201-204 may be said to have a major surface referred to herein as a top side, or sensor side, and a major surface opposite the top side referred to herein as a bottom side, or back side. In the example embodiment of FIG. 2, M=2 and N=2, although other embodiments are possible, and are considered as alternative embodiments herein, whereby M and N are counting numbers (i.e., positive integers 1, 2, 3 . . . ) having the same or different value, wherein at least one of M or N must be greater than 1. The sensor tiles 201-204 may also be referred to herein individually as "a die" or in plural as "die", since the sensor die are typically precision cut or "diced" from a larger piece of thin-film transistor (TFT) glass or silicon wafer. The plurality of die need to be aligned to each other in the X, Y, and Theta-Z ($\theta_z$) axes as indicated by the arrows 208 in FIG. 2. The gap indicated by arrows 206 between adjacent die is intended to be minimized as the die are finally positioned, and may comprise a distance of about half the width (or length) of a pixel, or less, wherein a pixel width (or length) may be defined and measured by reference to one or more pixels formed on one or all of the die 201-204, such as by reference to a mean pixel width (or length), a designed width (or length) of the pixels, or a mean dimension of the pixels which may be a mean length or width. The alignment is accomplished in such a way as to also minimize the number of "dead zone" pixels between die that may otherwise appear in a radiographic image captured by the detector 114. An integer number of dead zone pixels between die is desired, with a one (1) pixel width dead zone being preferred. Such alignment between the die may be typically controlled to a tolerance of about $\frac{1}{10}^{th}$ (0.1) pixel. Alignment to this precision may be necessary to produce artifact-free projection radiographic images.

Electrical contacts or bond pads 210 on the die 201-204 are disposed adjacent to one edge of each die 201-204. This enables what is known to those skilled in the art as a 3-side buttable configuration. While an arrangement of four die are shown in FIG. 2, the present invention is not limited to four die, as additional die can be aligned in the X-direction, maintaining the 3-side buttable configuration.

FIGS. 3A and 3B show side and top views, respectively, of one embodiment of an image sensor assembly 115 of the present invention. After alignment of the image sensor array 200 (FIG. 2), a rigid substrate 302 is mated to the M×N arrangement of die 200 using a compliant layer, support, sheet, or film 306. Printed circuit boards (PCBs) 308, 309, with analog and/or digital detector electronics can be added to the substrate 302 using adhesive 508, 509 (FIG. 5), respectively, and electrically connected to the image sensor arrangement 200 as an integral part of the image sensor assembly 115. Electrical contacts between the image sensor tiles 201-204 and the PCBs 308, 309 may include wire bonding 310, anisotropic conductive film (ACF) bonding through flex circuits, or other suitable electrical contact means and methods. The major surfaces of the die 201-204 facing outward from the page of FIG. 3B are the top sides, or top surfaces, of the sensor tiles 201-204, which face away from the substrate 302. The top sides, or sensor sides, are generally positioned by an operator of the imaging system 100 to face the x-ray source during examinations using the DR detector 114. The top surfaces 311, 312, 313, and 314 of the die 201, 202, 203, and 204, respectively, are illustrated in the side and top views of FIGS. 3A and 3B.

Figure 4:
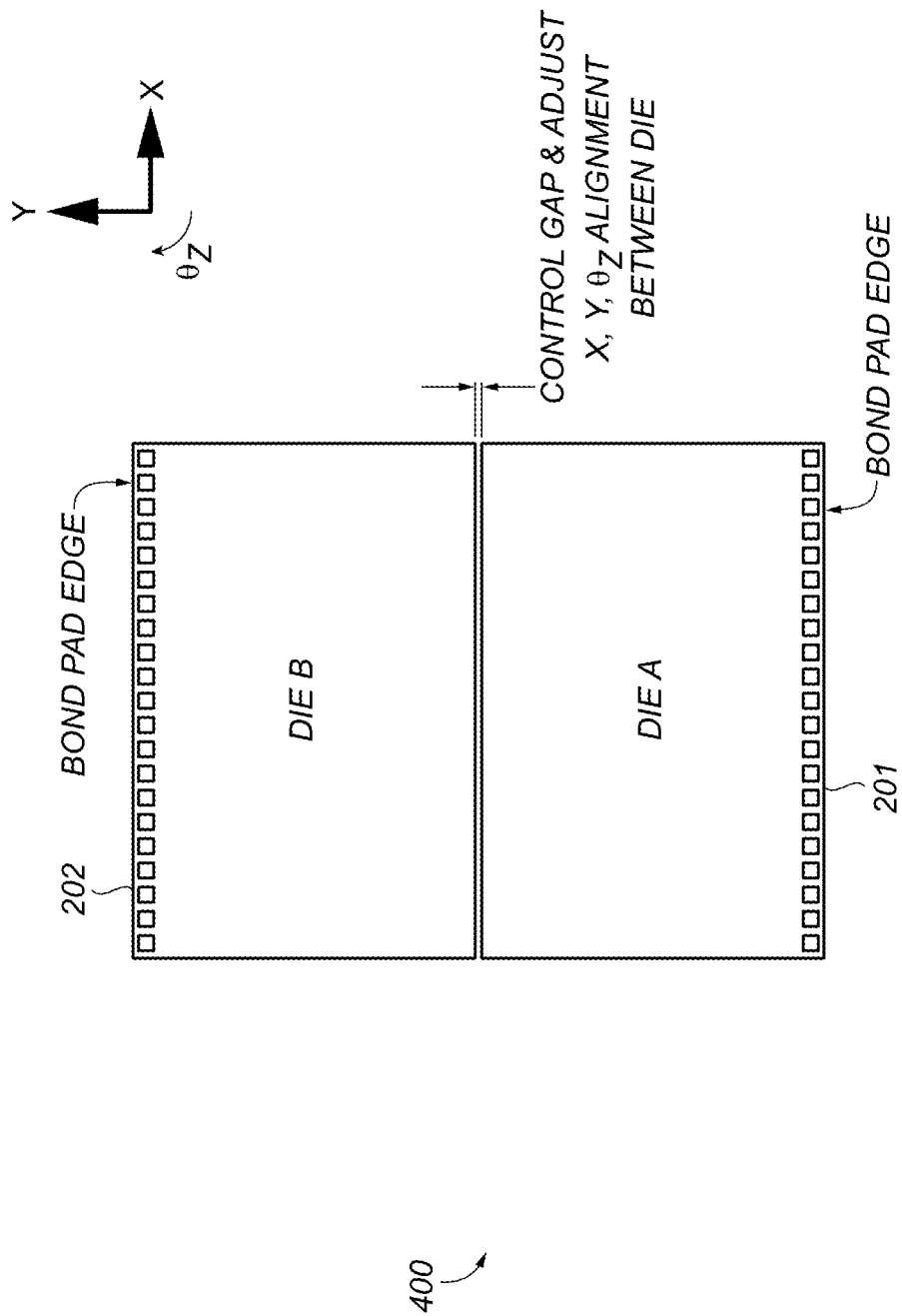
FIG. 4 is a diagram of another exemplary M×N two dimensional arrangement of a plurality of die with alignment orientation.

For simplicity and ease of understanding of the details of the present invention, the two die 201, 202, M×N configuration 400 as shown in FIG. 4, where M=1 and N=2, will be described herein as an exemplary embodiment used in making the image sensor assembly 115. Other M×N configurations of various sizes are considered to be within the scope of the claims appended hereto and of the following description.

Figure 5:
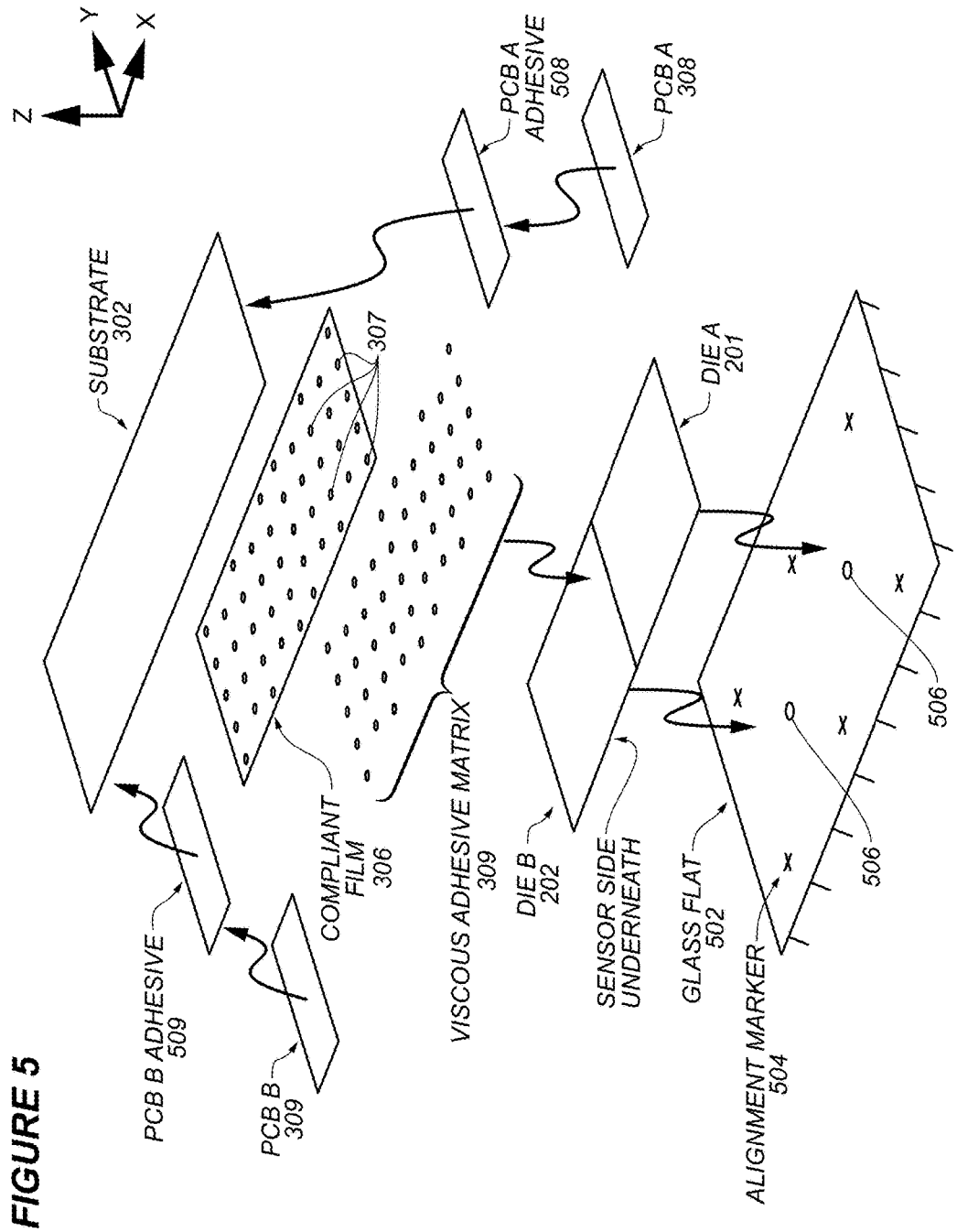
FIG. 5 is an exploded isometric view of an exemplary tiled image sensor assembly using two die in an M×N two dimensional arrangement with glass flat and alignment markers.

FIG. 5 shows an exploded isometric view of the components used in the present invention as described above. Also shown in FIG. 5 is a glass flat 502 used during the die alignment process as described herein. The glass flat 502 is a planar, rigid device having a plurality of alignment markers 504 (six markers in the example of FIG. 5) on its flat, top surface which faces the sensor side of each die 201, 202. The glass flat 502 also includes a plurality of holes 506 formed therethrough corresponding to each of the die. In one embodiment, one of the holes 506 corresponds to each of the die 201, 202. As described herein, the holes 506 are used to secure the die 201, 202, to the glass flat using a vacuum (suction) source in communication with the holes 506 so that the holes 506 act as channels for the vacuum source. The compliant film 306 may have perforations 307 formed therethrough corresponding to a pattern 309 of adhesive 1108 (FIG. 11) applied therein, as will be explained below.

Figure 6:
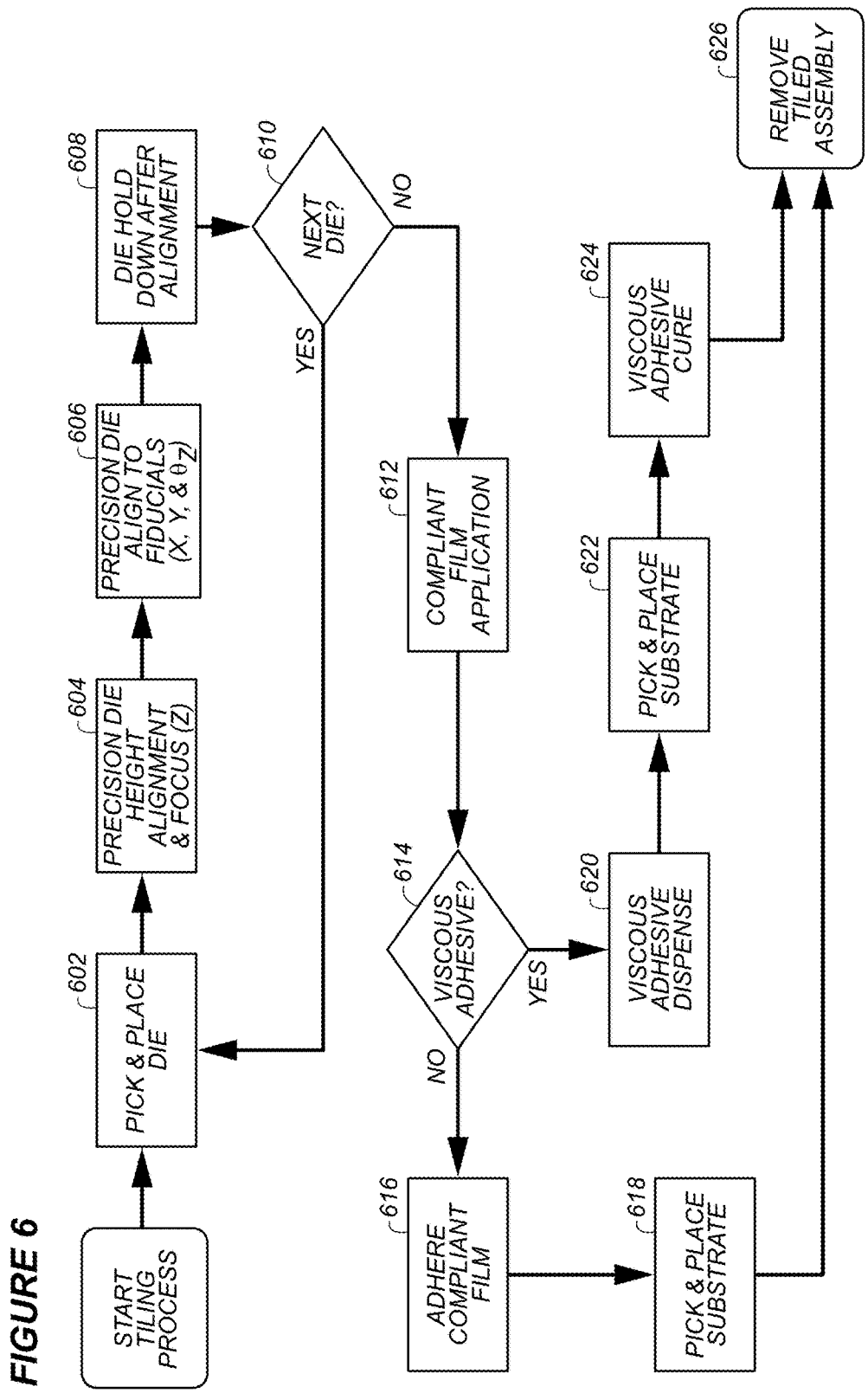
FIG. 6 is a flow chart of an exemplary method of making the tiled image sensor assembly of FIGS. 3A-3B and FIG. 5.
Figure 7:
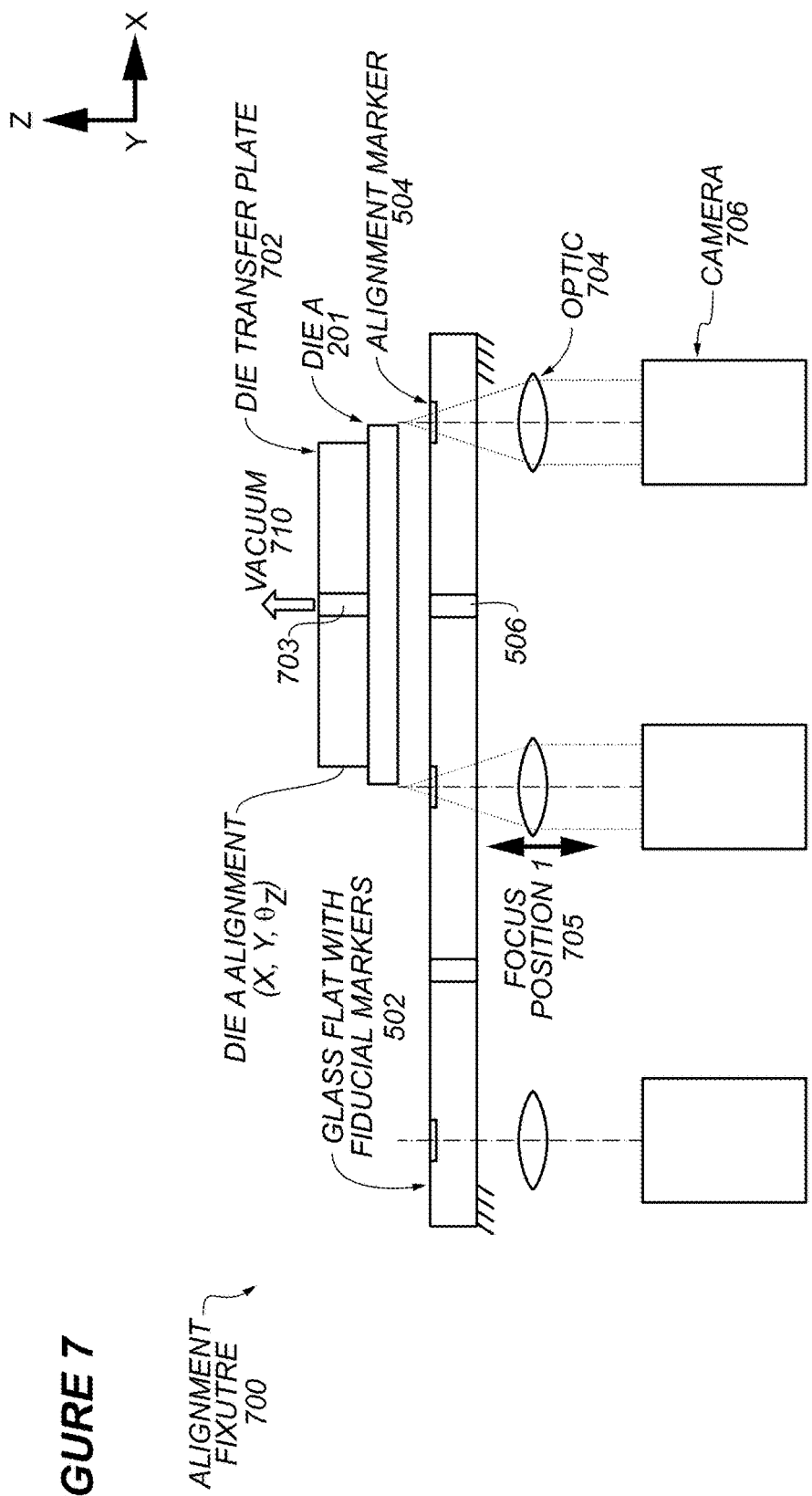
FIG. 7 is a side view showing a step of the exemplary method of making the exemplary tiled image sensor assembly.

FIG. 6 is a flow chart of an exemplary method of making a plurality of embodiments of the present invention. The steps illustrated in FIG. 6 will be explained in more detail with reference to FIGS. 7-15. Steps 602-606 will now be described with respect to FIG. 7. At step 602, a die 201 is selected and placed upon the glass flat 502 alignment fixture having alignment markings 504 thereon to align the die 201 thereto. A protective layer (not shown) may be applied to at least the sensor side of the die 201 prior to or during the procedure described herein, which may be removed later as desired.

In this example, to place the die 201 on the glass flat 502, the die 201 is first held against a transfer plate 702 which has at least one hole 703 formed therethrough, whereby a vacuum source 710 is applied to the hole 703 to hold the die 201 against the plate 702 while moving and positioning the die 201 above selected ones of the alignment markers 504 on the glass flat 502. A vacuum (suction) source 710 is in communication with the hole 703 so that the hole 703 may act as a channel for the vacuum. Alternatively, a clamp may be used in place of the transfer plate+vacuum source. A mechanism (not shown) may be attached to the transfer plate 702 to facilitate movement and positioning of the die 201. At step 604, a vision camera 706 and optics 704 may be used to image features of the die 201 (such as an edge of the die 201) and selected alignment markers 504 through the glass flat 502. Thus, the glass flat 502 is advantageously made from a suitably transparent material sufficient to allow use of the camera 706 for viewing therethrough. The optics 704 may be adjustable to allow adequate focusing of either or both the die 201 and selected alignment markers 504. At step 606, alignment of the die 201 in the X, Y, $\theta_z$, directions is performed.

Figure 8:
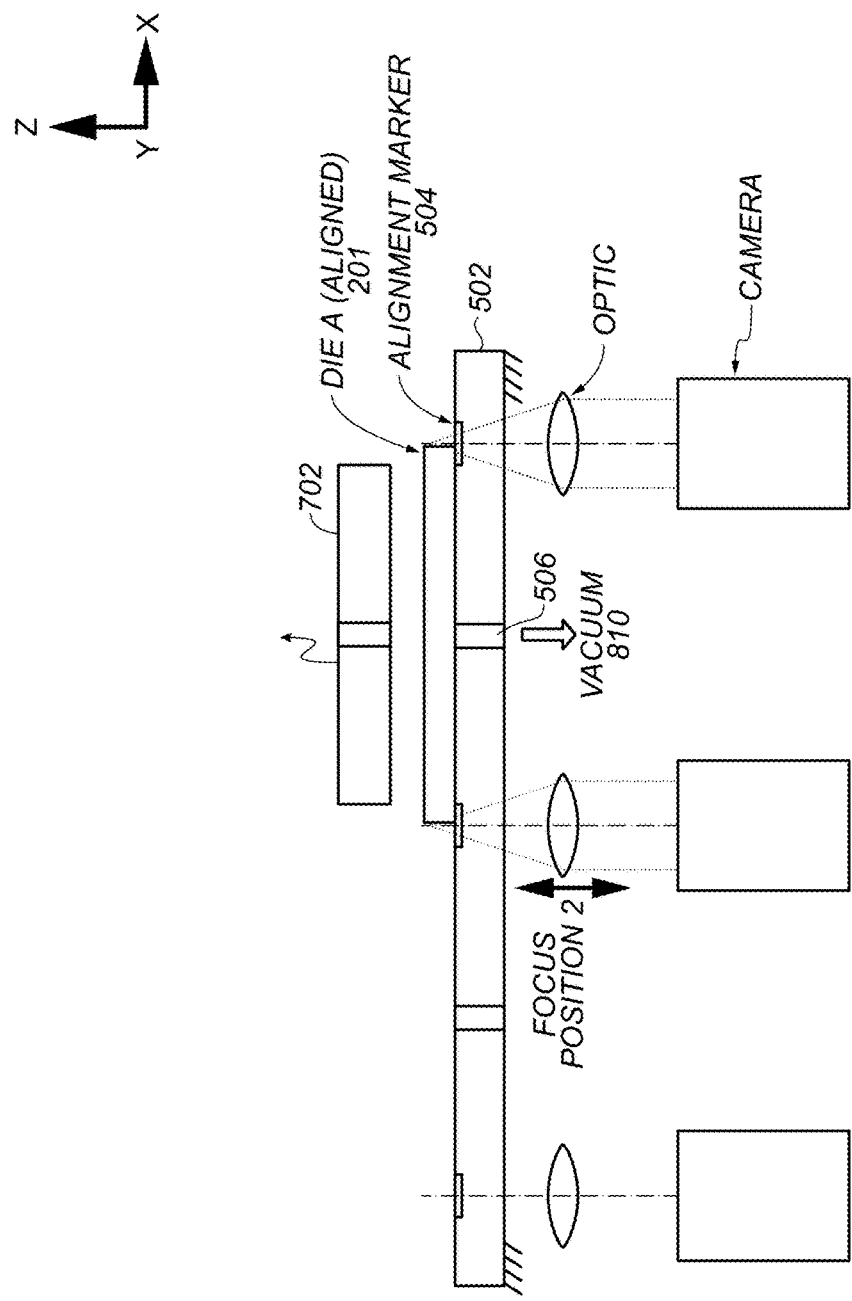
FIG. 8 is a side view showing another step of the exemplary method of making the exemplary tiled image sensor assembly.
Figure 9:
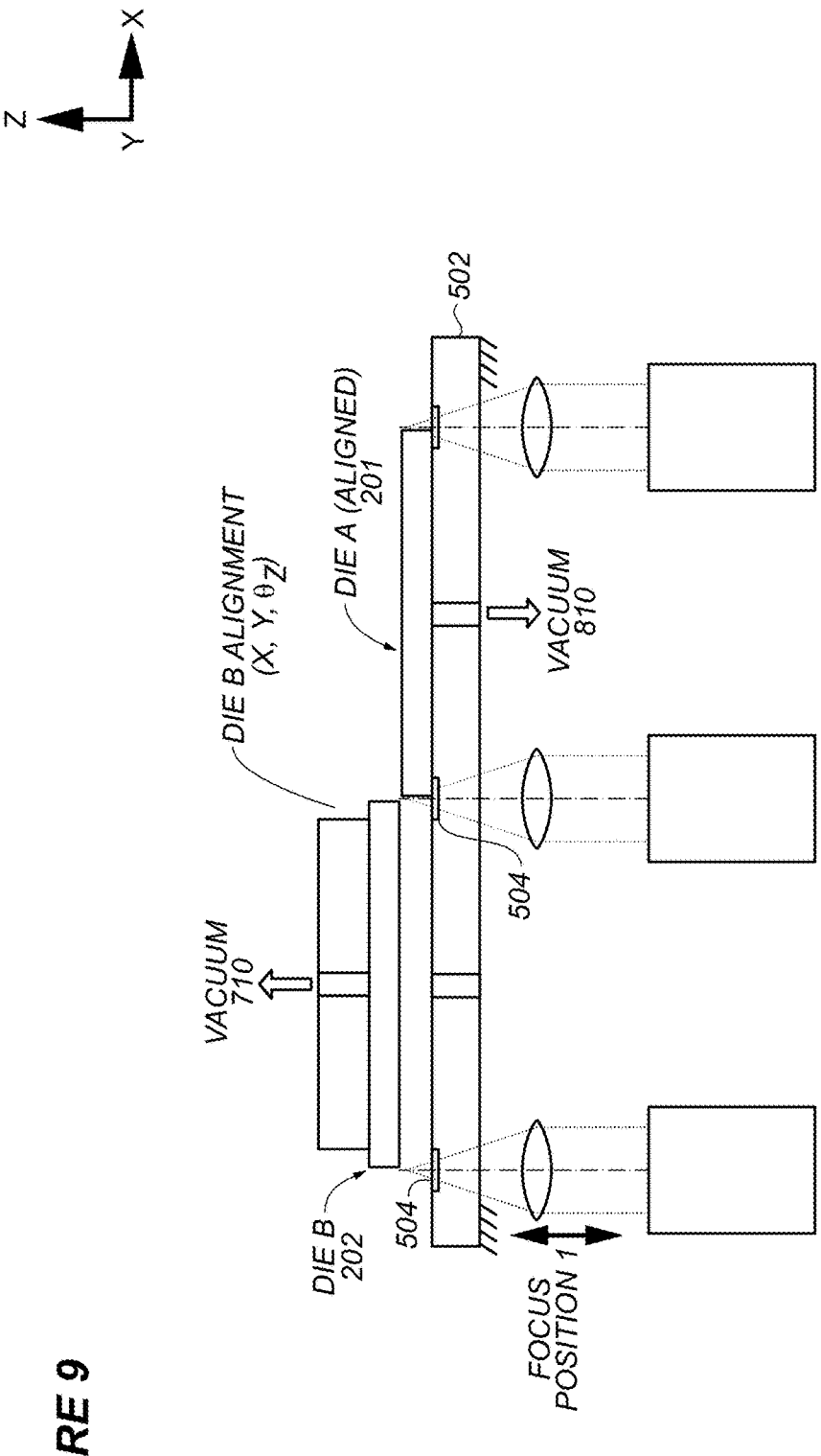
FIG. 9 is a side view showing another step of the exemplary method of making the exemplary tiled image sensor assembly.
Figure 10:
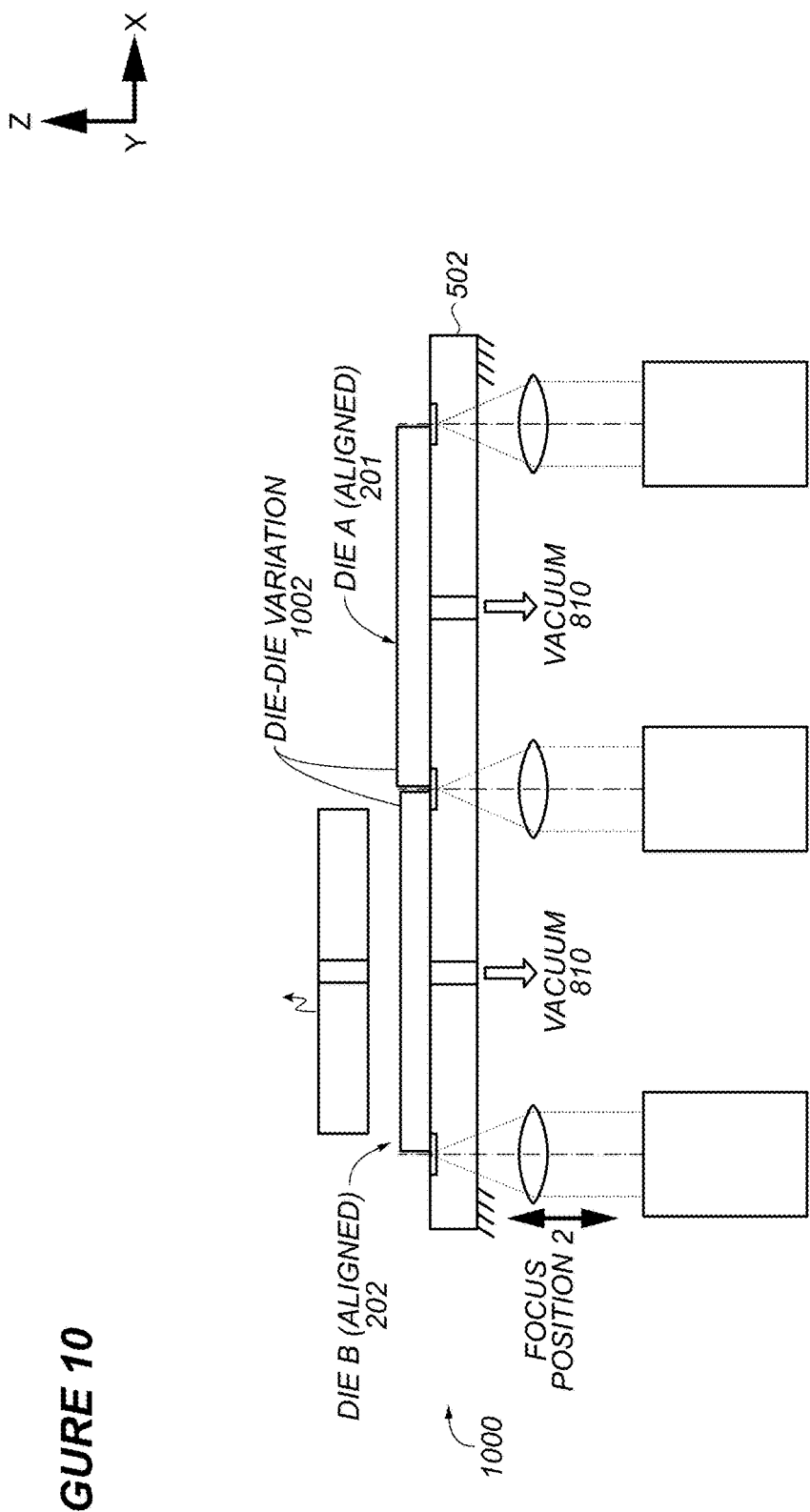
FIG. 10 is a side view showing another step of the exemplary method of making the exemplary tiled image sensor assembly.

After a final alignment of the die 201 is achieved, with reference to FIG. 8 and step 608, a vacuum source 810 is applied to the bottom of the hole 506 in the glass flat 502 to engage the die 201 against the top surface of the glass flat 502. Vacuum 710 to the transfer plate 702 is then removed to disengage the transfer plate 702 from the die 201, leaving the die 201 secured against glass flat 502. At decision step 610, with reference to FIGS. 9-10, a second die 202 is then aligned adjacent to, or abutting, as desired, the first die 201 using selected alignment markers 504 on the glass flat 502. The second die 202 is aligned using the same process steps 602-608 as used to align the first die 201, described above. After alignment of the second die 202, returning to decision step 610, with reference to FIGS. 9-10, third and/or additional die, as desired, may then be aligned adjacent to, or abutting, as desired, the first or second die 201, 202, using selected alignment markers 504 on the glass flat 502 to form a completed aligned arrangement of die 1000 on the glass flat 502. The third and/or additional die may be aligned using the same process steps 602-608 as used to align the first and second die 201, 202. Because of die-to-die variations primarily due to thickness, runout, and wedge, the back sides (i.e., the surfaces facing away from the glass flat 502) of both die 201, 202 and any additional die, may not be co-planar. As an example, a 200 mm diameter silicon wafer that is diced to fabricate the die 201, 202 illustrated herein, may have thickness and flatness variations across its diameter as large as 0.050 mm. It is therefore desired that attachment of a substrate, as will be explained herein, to the plurality of die 201, 202 allow for these variations in thickness by using the compliant film 306 as described herein.

Figure 11:
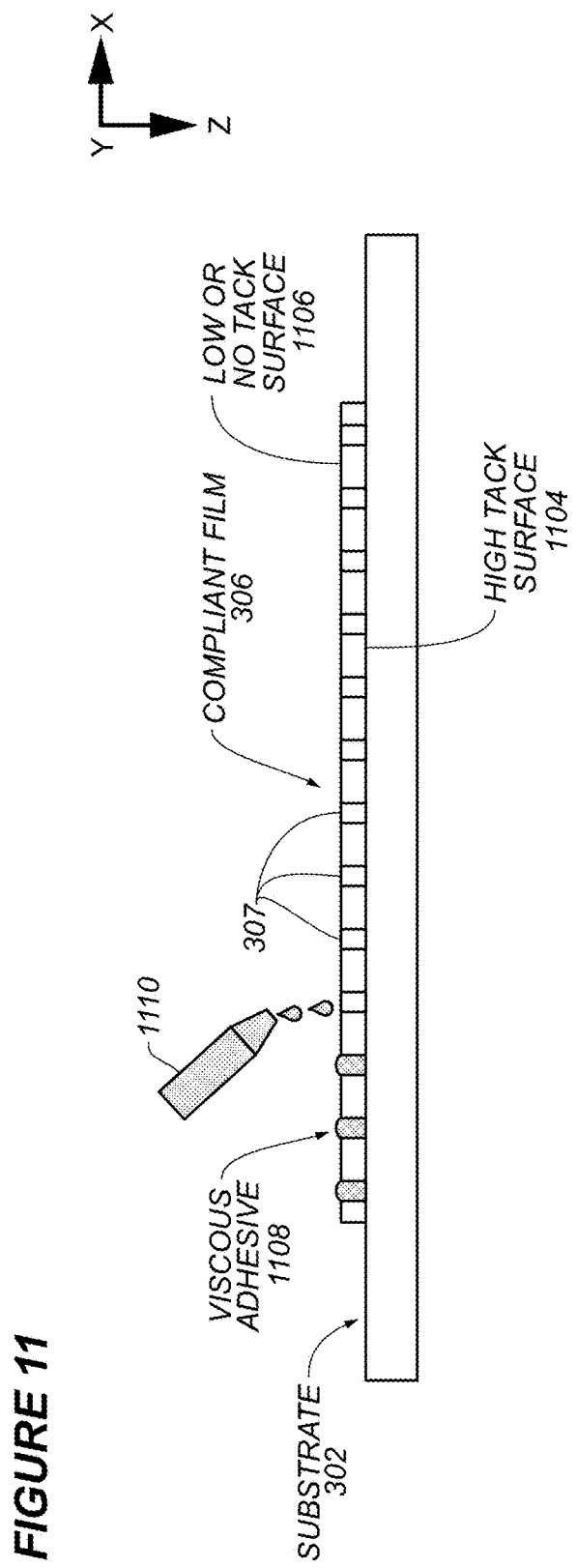
FIG. 11 is a side view showing another step of the exemplary method of making the exemplary tiled image sensor assembly.
Figure 12:
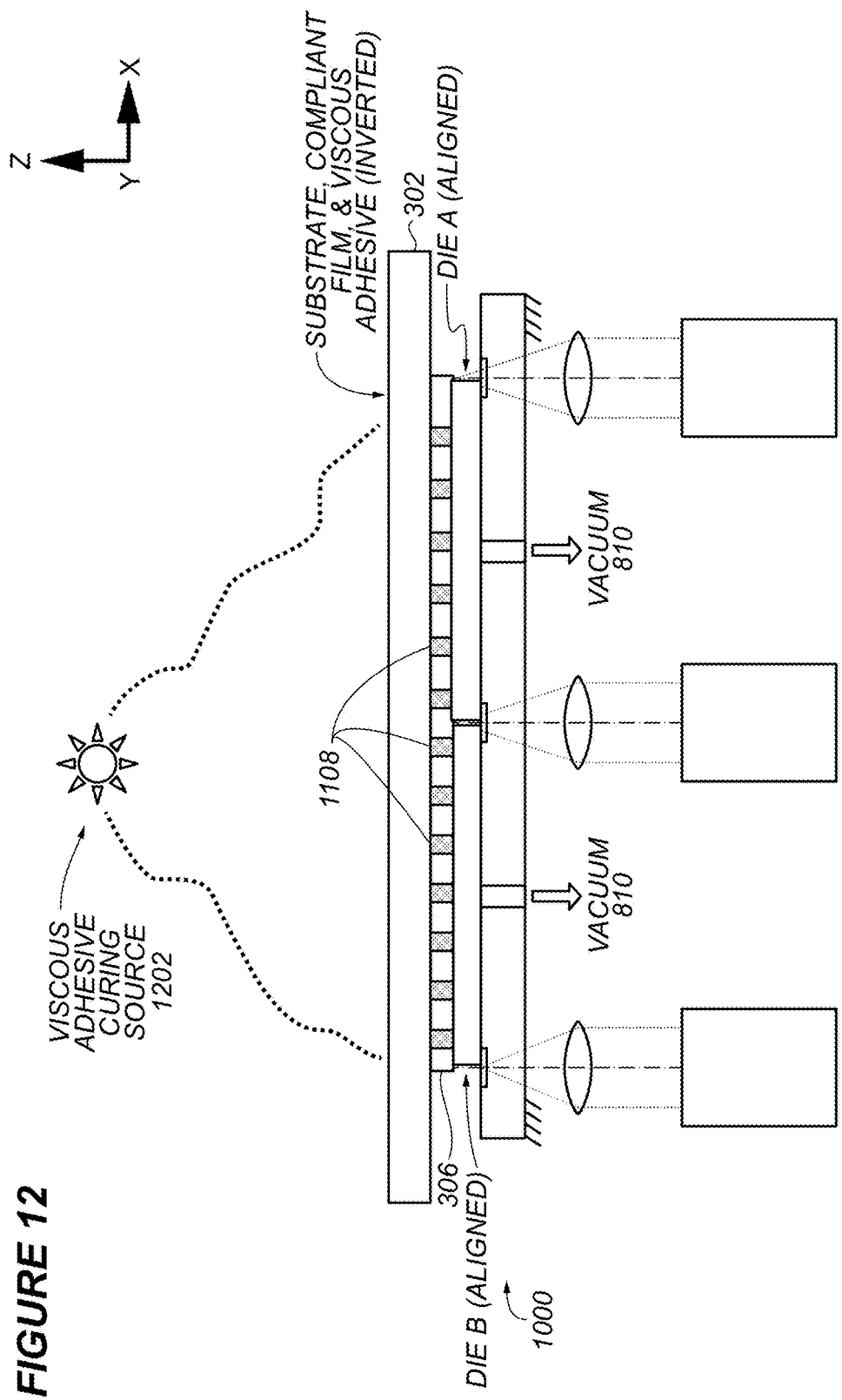
FIG. 12 is a side view showing another step of the exemplary method of making the exemplary tiled image sensor assembly.
Figure 13:
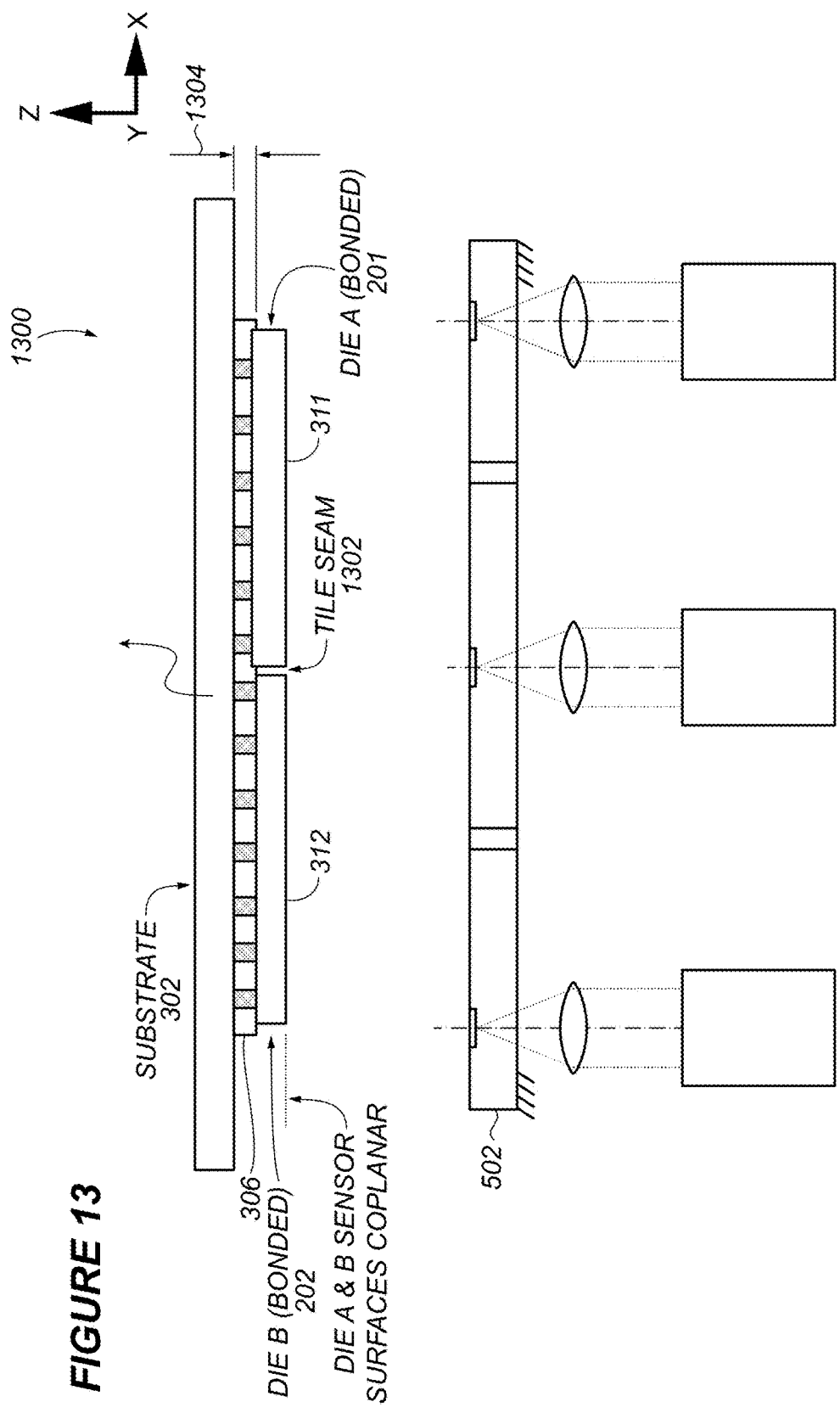
FIG. 13 is a side view showing another step of the exemplary method of making the exemplary tiled image sensor assembly.

After the desired number of die 201, 202 are aligned to the glass flat 502 as described herein, decision step 610 may be followed by steps 612 and 620, with reference to FIG. 11, wherein a compliant film 306, having a plurality of perforations 307 formed therethrough, is positioned on one surface of the substrate 302. The surface 1104 of the complaint film 306 that faces the surface of the substrate 302 may be fabricated to have, or may be later treated to provide, a higher coefficient of friction than its opposite side 1106 to facilitate a tackier engagement with the surface of the substrate 302. The opposite surface 1106 of the compliant film 306 that faces away from the substrate 302 may either have a lower tack for better repositioning capability against the dies 201, 202 (FIG. 12) or no tack at all. At step 620, a viscous, high tack, adhesive 1108 is dispensed into the perforations 307 in the compliant film 306 using a dispenser 1110 that places the adhesive 1108 at least into the perforations 307 so that the adhesive 1108 makes contact at least with the surface of the substrate 302, as shown in FIG. 11. The adhesive 1108 may be a UV, thermal, or room temperature curing adhesive, as desired. In one embodiment, the adhesive 1108 is a UV curing adhesive having a fast cure time and also minimizes strain and stress between the substrate and die during the curing operation (FIG. 12). In one embodiment, a compliant film 306 may be selected that has significantly lower stiffness and elastic modulus compared with the viscous adhesive 1108 after the adhesive is UV cured. One exemplary compliant film is manufactured and sold by the 3M company of St. Paul, Minn. under the name of VHB4914, which is 0.100 mm thick with elastic modulus $E_f$=0.6 MPa. Compliant films of greater thickness can be used as well, allowing for greater die-to-die flatness or thickness variation. An exemplary viscous adhesive 1108 is manufactured and sold by Dymax Corporation of Torrington, Conn., under the name of OP-61 which is a UV cure type adhesive with cured elastic modulus Ev=16,000 MPa and viscosity at 160,000 cP. This particular adhesive has low shrinkage at 0.4%, as well as low coefficient of thermal expansion at 43 parts per million per ° C. The compliant film 306 and adhesive 1108 properties cited herein are adequate to achieve thermal and long term stability of the tiled image sensor assembly 115.

With reference to FIG. 12 and step 622, the substrate 302 and the compliant film 306, having the viscous adhesive 1108 dispensed therein, are inverted and pressed against the aligned arrangement of die 1000, wherein the adhesive 1108 in the perforations 307 contacts the back sides of the die 201, 202. In one embodiment, using a curing adhesive, a curing process may be performed, at step 624. The substrate may be optically transparent to UV light in this embodiment. In one embodiment, a UV curing adhesive may be used and a curing source 1202, such as an ultraviolet (UV) light, may be used in a curing process at step 624. In one embodiment, a different adhesive may be used wherein no separate curing step is required. After adhesion of the substrate 302 to the aligned arrangement of die 1000 is complete, the vacuum source 810 applied to the holes 506 is turned off and, with reference to FIG. 13 and step 626, the tiled sensors 1300 are removed from the glass flat 502. At this point, the die 201, 202, top surfaces 311, 312, respectively, are coplanar, which is particularly critical at the tile seam 1302 so that adequate image sharpness and uniformity is achieved. The compliant film 306 is compressed to a smaller thickness 1304 between the substrate 302 and the die 201 as compared to its thickness between the substrate 302 and the die 202. This is due to the variation in thickness of the die 201, 202 (the die 201 is thicker) when the die 201, 202, are pressed against the compliant film 306.

After the desired number of die 201, 202 are aligned to the glass flat 502 as described herein, decision step 610 may alternatively be followed by steps 612 and 616, with reference to FIG. 11, wherein a compliant film 306, having a plurality of perforations 307 formed therethrough, is positioned on and adhered to one surface of the substrate 302. Although not shown, an alternative compliant film without perforations may be positioned and adhered on one surface of the substrate 302. The compliant film 306 with or without perforations may be coated, treated, layered, impregnated, with an adhesive on one or both its major surfaces. Alternatively, the compliant film 306 may not be used in the method described herein and only an adhesive may be placed between the substrate and die 201, 202. The adhesive described herein may be a UV, thermal, or room temperature curing adhesive, as desired. In one embodiment, the adhesive is a UV curing adhesive having a fast cure time and also minimizes strain and stress between the substrate and die during the curing operation (FIG. 12).

With reference to FIG. 12 and step 618, the substrate 302 and the compliant film 306, with or without perforations, having adhesive thereon, as described herein, are inverted and pressed against the aligned arrangement of die 1000. In one embodiment using a curing adhesive, the adhesive compliant film 306 contacts the back sides of the die 201, 202, and a curing process may be performed. In one embodiment, a UV curing adhesive may be used and a curing source 1202, such as an ultraviolet (UV) light, may be used in a curing process. In one embodiment, a different adhesive may be used wherein no separate curing step is required. After adhesion of the substrate 302 to the aligned arrangement of die 1000 is complete, the vacuum source 810 applied to the holes 506 may be turned off and, with reference to FIG. 13 and step 626, the tiled sensors 1300 are removed from the glass flat 502. At this point, the die 201, 202, top surfaces 311, 312, respectively, are coplanar, which is particularly critical at the tile seam 1302 so that adequate image sharpness and uniformity is achieved. The compliant film 306, with or without perforations, is compressed to a smaller thickness 1304 between the substrate 302 and the die 201 as compared to its thickness between the substrate 302 and the die 202. This is due to the variation in thickness of the die 201, 202 (the die 201 is thicker) when the die 201, 202, are pressed against the compliant film 306.

Figure 14:
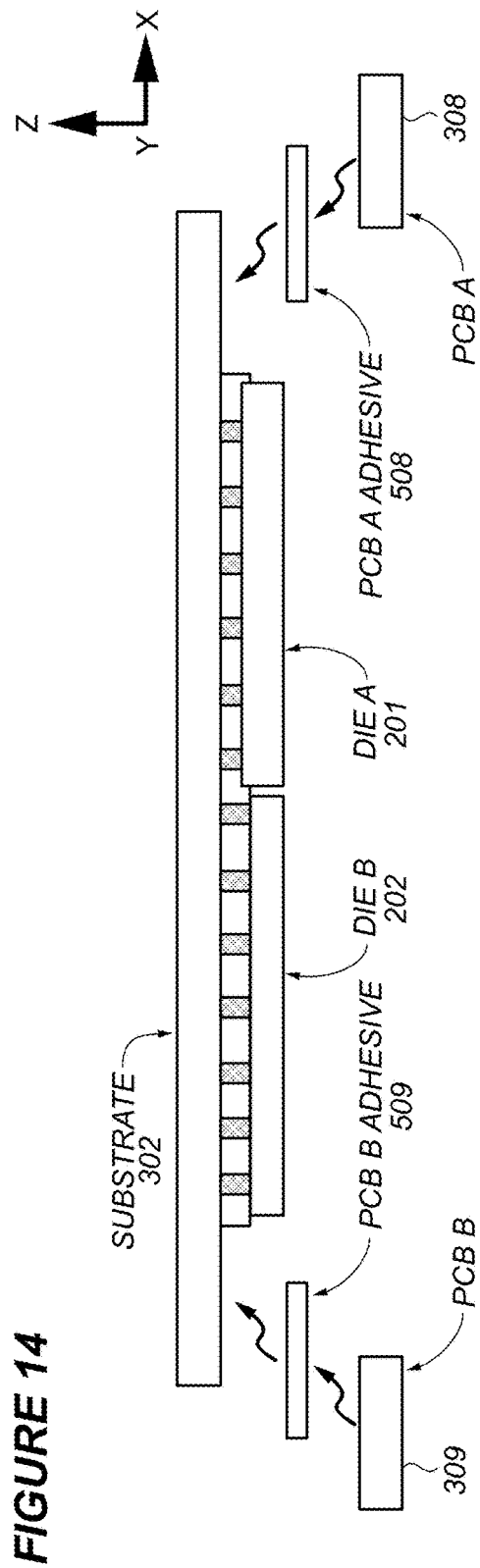
FIG. 14 is a side view showing another step of the exemplary method of making the exemplary tiled image sensor assembly.
Figure 15:
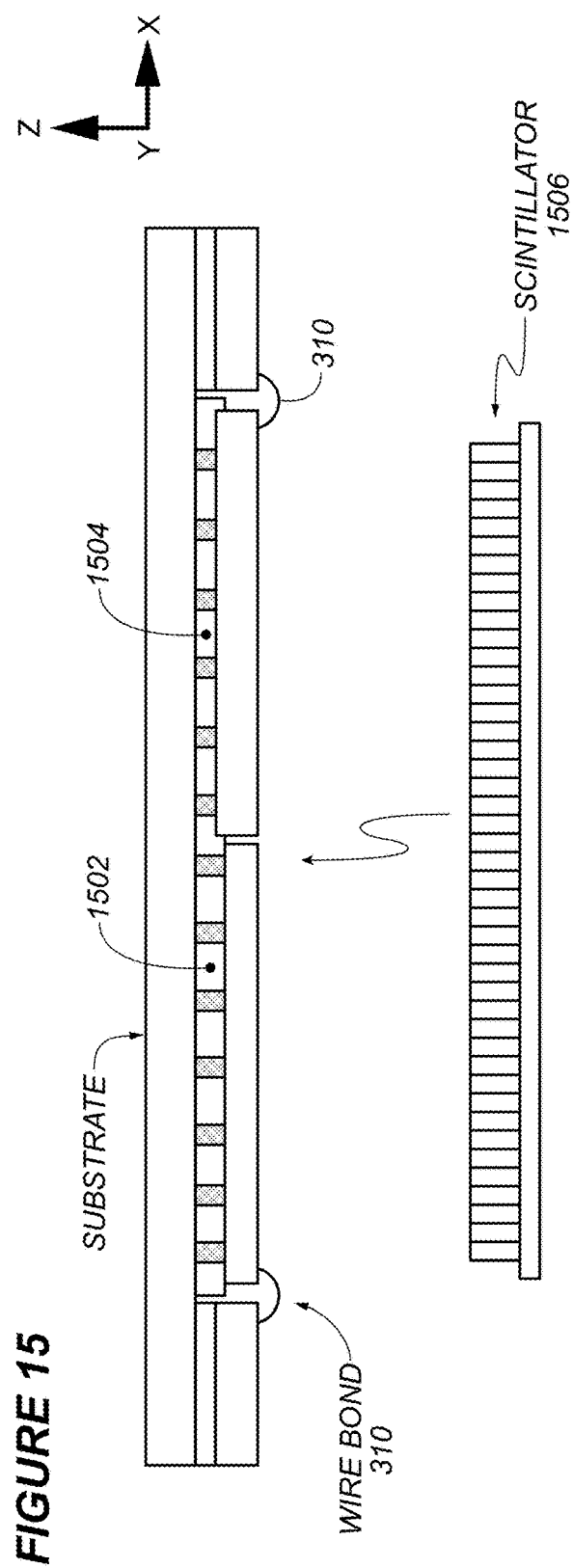
FIG. 15 is a side view showing another step of the exemplary method of making the exemplary tiled image sensor assembly.

After the step 626 is complete, with reference to FIG. 14, respective PCBs 308, 309, can be attached to the substrate 302 using adhesives 508, 509, respectively, pressure sensitive adhesive (PSA), fasteners, or other means. With reference to FIG. 15, electrical connection between the PCBs 308, 309, and the die 201, 202 may be formed using wire bonds 310, or other means as described herein. A scintillator 1506 for use as an x-ray wavelength converter, in embodiments using indirect conversion image sensors, may be applied to the top surfaces of the tiled sensors, 201, 202, to form the image sensor assembly 115. Application of the scintillator 1506 to the tiled sensors 201, 202, can be performed via pressure, optical coupling adhesive (OCA) attachment, or similar optical coupling gels or adhesives.

Figure 16B:
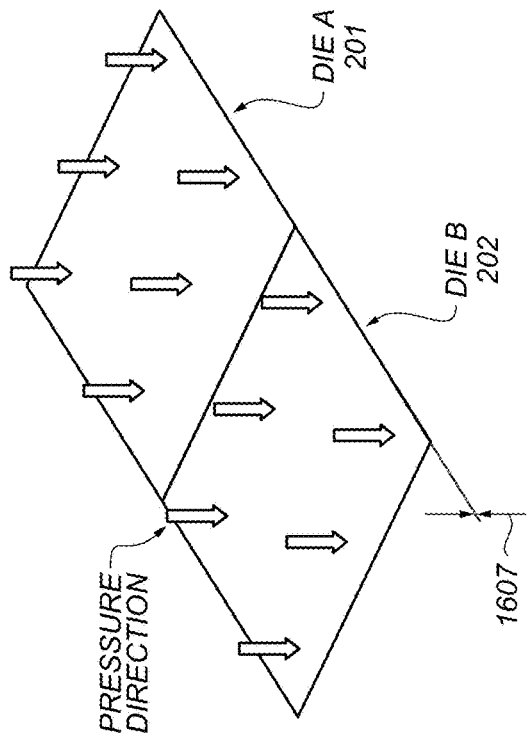
FIGS. 16A-16B are perspective views illustrating a pressure direction applied to the sensor tiles and a representative deflection in the sensor tiles caused thereby.
Figure 16A:
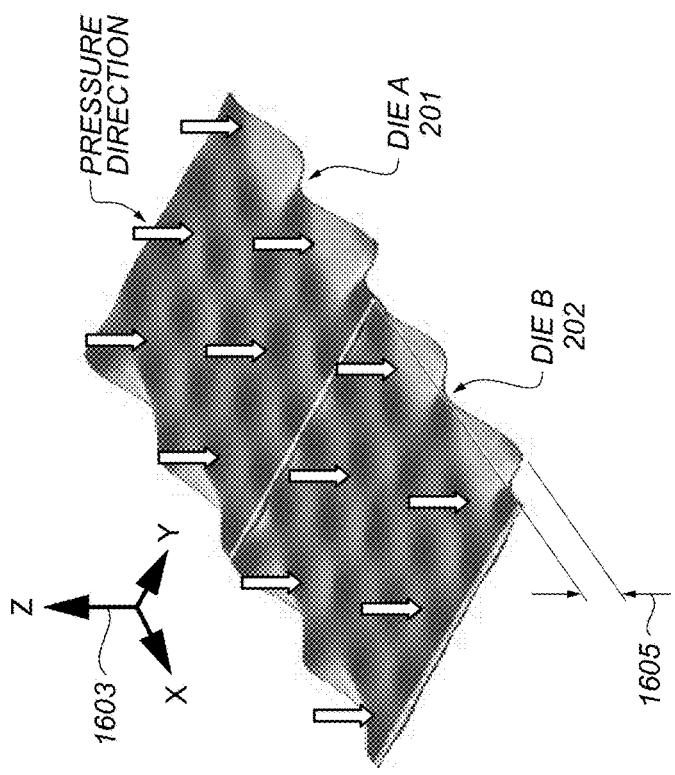

Finite Element Analysis (FEA) simulation was performed to measure the effect of attaching a scintillator against the tiled sensor assembly, with and without the compliant film 306. For this simulation, uniform pressure 1601 of 0.5 MPa was applied on top of both die 201, 202. FIG. 16A shows a representation of the measured peak-to-peak deformation 1605 of the die 201, 202, in the Z-direction 1603, i.e., deviation from a planar shape in the x-y plane, when only a viscous adhesive is adhered between the die 201 and substrate 302. FIG. 16B shows a representation of the measured deformation 1607 of the die 201, 202, in the Z-direction 1603 when both a viscous adhesive 1108 and compliant film 306 are adhered between the die 201, 202, and substrate 302. Maximum deformation 1605 for the case with only the viscous adhesive 1108 was measured as 0.325 mm, and the deformation 1607 for the case with both the viscous adhesive 1108 and the compliant film 306 was measured at 0.015 mm. Thus, the deformation is significantly reduced, by over 20×, when using the compliant film 306. This will result in superior scintillator attachment and imaging performance.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed:

1. A method of fabricating a tiled sensor array, the method comprising:
   providing a plurality of M×N sensor tiles, where M and N are positive integers;
   providing a substrate facing a bottom side of each of the sensor tiles;
   placing a compressible, compliant material between the array of sensor tiles and the substrate;
   disposing a first adhesive between the array of sensor tiles and the substrate, the first adhesive contacting the compliant material, the substrate, and the bottom side of the sensor tiles.

2. The method of claim 1, wherein the substrate comprises a top surface facing the bottom side of each of the sensor tiles, and wherein the apparatus further comprises electronic circuits attached to the top surface of the substrate.

3. The method of claim 2, wherein the electronic circuits are electrically connected to the array of sensor tiles.

4. The method of claim 2, further comprising a second adhesive between the electronic circuits and the top surface of the substrate, wherein the second adhesive is the same as, or different from, the first adhesive.

5. The method of claim 1, wherein top sides of the sensor tiles are in a common plane, the bottom sides of two of the sensor tiles are each in a different plane, and wherein the compliant material is compressed against the substrate to a different thickness by each of said two of the sensor tiles.

6. The method of claim 1, further comprising a scintillator material over the top surface of the sensor tiles.

7. The method of claim 1, wherein the compliant material is perforated, the first adhesive is disposed in the perforations of the compliant material, and wherein a surface of the perforated compliant material that faces the sensor tiles comprises a lower coefficient of friction than a surface of the compliant material that faces the substrate.

8. The method of claim 1, wherein a gap between adjacent edges of two of the sensor tiles is less than a mean dimension of the pixels of the sensor tiles.

9. The method of claim 1, wherein the first adhesive, when cured, comprises an elastic modulus at least about 10000 times greater than an elastic modulus of the compliant material.

10. A method of fabricating a tiled sensor array, the method comprising:
   providing a substantially flat surface;
   aligning a plurality of sensor tiles using the flat surface;
   providing a substrate;
   placing a compliant layer in contact with the substrate;
   disposing an adhesive in contact with the substrate and with the compliant layer; and
   pressing the compliant layer against the back sides of the plurality of sensor tiles including disposing the adhesive in contact with the substrate and with the back sides of the plurality of sensor tiles.

11. The method of claim 10, wherein the compliant layer comprises a plurality of perforations therethrough, the step of disposing comprises disposing the adhesive into the plurality of perforations such that the adhesive is in contact with the substrate, and wherein the step of pressing comprises the adhesive in the perforations contacting the back sides of the plurality of sensor tiles.

12. The method of claim 11, wherein the step of aligning the plurality of sensor tiles includes aligning the sensor tiles to each other using the flat surface.

13. The method of claim 11, wherein the step of aligning the plurality of sensor tiles includes viewing alignment markings of the flat surface or the sensor tiles using a camera while moving the sensor tiles into alignment.

14. The method of claim 11, wherein the flat surface comprises channels to provide a vacuum path to a vacuum source, and the method further includes holding the sensor tiles on the flat surface in an aligned position using the vacuum source after the step of aligning the plurality of sensor tiles.

15. The method of claim 11, wherein the step of aligning the plurality of sensor tiles comprises securing the sensor tiles to a transfer mechanism using a vacuum source.

16. The method of claim 11, wherein the compliant layer comprises a first surface and a second surface, the first surface of the compliant layer having a coefficient of friction greater than the second surface, and wherein the method further comprises placing the first surface of the compliant layer in contact with the substrate.

17. An apparatus comprising:
   an M×N array of photosensitive tiles, wherein M and N are positive integers;
   a substrate facing a bottom side of each of the sensor tiles; and
   a compliant material between, the array of photosensitive tiles and the substrate, wherein the compliant material includes adhesive to secure together the substrate and the array of photosensitive tiles, a thickness of the compliant material is different between the substrate and a first one of the tiles compared to its thickness between the substrate and a second one of the tiles, and wherein top sides of the sensor tiles are aligned.

18. The apparatus of claim 17, wherein the compliant material comprises a plurality of perforations therethrough, the perforations comprise the adhesive therein, and wherein the adhesive in each perforation is in contact with the substrate and with one of the photosensitive tiles.

19. The apparatus of claim 17, wherein alignment between adjacent tiles is controlled to a tolerance of $\frac{1}{10}^{th}$ (0.1) pixel or less than 10 microns.

20. The apparatus of claim 17, wherein a deviation of the tiles from a planar shape is equal to or less than about 0.3 mm.

* * * * *